United States Patent
Fagerness

Patent Number: 5,862,151
Date of Patent: Jan. 19, 1999

[54] ARRAY SELF-TEST FAULT TOLERANT PROGRAMMABLE THRESHOLD ALGORITHM

[75] Inventor: Gerald G. Fagerness, Mazeppa, Minn.

[73] Assignee: Unisys Corporation, Blue Bell, Pa.

[21] Appl. No.: 788,109

[22] Filed: Jan. 23, 1997

[51] Int. Cl.$^6$ ................................................. G01R 31/28
[52] U.S. Cl. ..................................... 371/22.5; 395/183.06
[58] Field of Search ........................... 371/22.5, 24, 25.1, 371/22.31, 21.2, 21.4, 22.1, 26, 27.5, 28; 395/183.01, 183.06, 183.12, 185.01, 181, 182.04, 182.09, 183.18, 184.01; 365/201, 189.07; 364/550, 489

[56] References Cited

U.S. PATENT DOCUMENTS

| | | | |
|---|---|---|---|
| 4,334,307 | 6/1982 | Bourgeois et al. | 371/16 |
| 4,527,251 | 7/1985 | Nibby, Jr. et al. | 364/900 |
| 5,157,781 | 10/1992 | Harwood et al. | 395/575 |
| 5,173,906 | 12/1992 | Dreibelbis et al. | 371/22.5 |
| 5,388,104 | 2/1995 | Shirotori et al. | 371/21.1 |
| 5,410,545 | 4/1995 | Porter et al. | 371/21.6 |
| 5,471,482 | 11/1995 | Byers et al. | 371/21.2 |
| 5,475,815 | 12/1995 | Byers et al. | 395/183.08 |
| 5,481,713 | 1/1996 | Wetmore et al. | 395/700 |
| 5,568,437 | 10/1996 | Jamal | 365/201 |
| 5,570,376 | 10/1996 | Kunda et al. | 371/25.1 |
| 5,596,716 | 1/1997 | Byers et al. | 395/185.01 |
| 5,617,531 | 4/1997 | Crouch et al. | 395/183.06 |
| 5,633,877 | 5/1997 | Shephard et al. | 371/22.2 |
| 5,659,551 | 8/1997 | Huott et al. | 371/22.2 |
| 5,661,732 | 8/1997 | Lo et al. | 371/22.2 |

OTHER PUBLICATIONS

Donaldson, "Partial RAMs can fill today's memory boards", *Electronics*, Jan. 17, 1980, pp. 131–134.

*Primary Examiner*—Robert W. Beausoliel, Jr.
*Assistant Examiner*—Nadeem Iqbal
*Attorney, Agent, or Firm*—Nawrocki, Rooney & Sivertson, P.A.

[57] ABSTRACT

The present invention relates to a method and apparatus for a greater-than-zero, programmable array fault tolerance used during built-in self-test (BIST) operation. In a first embodiment, a single BIST engine is provided for selected memory elements existing on a die within a logic array. The fault tolerance is set by scanning a register to a number between 0 and 7 to determine the number of faults that are tolerated before the array is considered unusable. After all of the selected memory elements are tested, the die is deemed usable if the total error count does not exceed the fault tolerance contained in the scannable register. Alternatively, each of the selected memory elements on the die may have a dedicated BIST engine. If fault tolerance is enabled for a particular BIST engine, the die will be deemed unusable if more than one fault is detected for the particular memory element associated with the dedicated BIST engine, or alternatively, if the total number of faults detected by all of the BIST engines exceeds the a predetermined fault tolerance number.

29 Claims, 7 Drawing Sheets

ARRAY SELF-TEST FAULT TOLERANT PROGRAMMABLE THRESHOLD ALGORITHM

CROSS REFERENCES TO CO-PENDING APPLICATIONS

This application is related to U.S. patent application Ser. No. 08/788,111, filed Jan. 23, 1987, entitled "Fault Isolating to a Block of ROM", assigned to the same assignee as the present application and incorporated herein by reference.

BACKGROUND OF THE INVENTION

1. Field of the Invention

The present invention relates to a method and apparatus for detecting faults in memory elements, and more particularly relates to detecting faults using built-in self-test (BIST).

2. Description of the Prior Art

During the production of integrated circuits, silicon wafers are manufactured which typically have a large number of die. Each die may contain a circuit, such as an application specific integrated circuit (ASIC). Once the wafers have completed processing, wafer level testing is performed to determine whether the die are functional and/or meet another desired specifications. Typically a large portion of the die on a wafer must be discarded due to manufacturing defects.

Some defects may cause a die to be non-functional. For example, a dust particle that is present during a masking operation may result in one or more logic elements being nonfunctional. Other defects may cause a die to not meet other specifications, such as operating speed. In either case, die that have even a single defect are often deemed unusable, and discarded. The number of usable die divided by the number of total tested die is defined as die yield. Typically, 20 to 30 percent of the die on a wafer must be usable for the production of an ASIC design to be commercially feasible.

Modern integrated circuits are increasing in both density and size. Both of these factors tend to decrease the die yield. As the die area increases, there is an increased probability that a defect will occur on the die. Likewise, as the density increases, the manufacturing tolerances are typically reduced and the chance for a defect is also increased.

Die containing a large number of storage devices, such as random access memories (RAM) or read only memories (ROM), are particularly susceptible to processing defects. RAMs and ROMs are typically designed using minimum width and spacings dimensions to achieve the largest number of storage elements in the smallest possible area. RAMs and ROMs are typically the most dense circuit elements of a circuit design, and can consume a substantial portion of the die area.

The memory elements in an ASIC design are often not directly accessible from the chip I/O pins. To detect these types of defects, techniques such as built-in self-test (BIST) have been developed. BIST circuitry is typically designed directly into the circuit design, and often includes providing a number of serial scan chains within the circuit design. Serial scan test vectors may then be shifted through the serial scan chains to control selected nodes therein. The circuit design may then be clocked once by the functional clock, and the results may be serially shifted out of the serial scan chains and compared to an expected value. Using BIST in this manner is well known in the art, and can improve the fault coverage that can be obtained for a given circuit design.

The standard method for testing a circuit design, using BIST or otherwise, is to test a particular die until a single defect is detected. After a single defect is detected, the test is typically terminated and the die is marked as unusable or discarded. Because modern integrated circuits have an increased probability of having a defect therein, as described above, discarding a die because of a single defect can reduced the commercially feasible of producing many ASIC designs. This is particularly true for those ASIC designs that include large or many memory elements.

SUMMARY OF THE INVENTION

The present invention overcomes many of the disadvantages found in the prior art by providing a method and apparatus for identifying the number and location of one or more defects in a memory element of an integrated circuit die. The number and location of the identified defects may then be recorded, and those locations may be avoided during functional operation of the circuit design. This may render die that have one or more defects usable, and may substantially increase the effective die yield of many integrated circuits.

More specifically, and in a first embodiment of the present invention, a programmable fault tolerance apparatus is provided to execute a built-in self-test operation on a logic array circuit having a number of memory storage devices therein. The programmable fault tolerance apparatus preferably includes a built-in self-test engine. The built-in self-test engine is coupled to each of the memory storage devices on the logic array circuit, and may test each memory storage device to determine if any faults exist therein. The built-in self-test engine may test each of the memory storage devices individually or may test all memory elements together. Alternatively, the built-in self-test engine may test each "type" of memory storage element together, for example, all RAMs may be tested first and all ROMs may be tested second.

The programmable fault tolerance apparatus may include a scratch pad memory storage device coupled to the built-in self-test engine for storing the locations of any faults that are detected. Further, an error counter may be coupled to the scratch pad memory storage device for storing the total number of defects detected. Preferably, the error counter counts the number of errors in each memory device, and the resulting count value is compared to a "programmable" fault tolerance number. The programmable fault tolerance number may be stored in a fault tolerance register, and may represent the maximum number of allowed faults before the die is deemed unusable. The programmable fault tolerance number can be changed by the user, and preferably by scanning in a new value when desired.

An advantage of having a "programmable" fault tolerance number is that BIST is often executed throughout the life of a die, including during wafer test, packaging and even in the field. As the die becomes further removed from the wafer stage, more fault occurrences are likely to be introduced. For example, die handling during the packaging process can create a fault that may not have existed before. Because the fault tolerance number is programmable, it can be changed throughout the die life to account for the these additional faults.

In a second embodiment of the present invention, the programmable fault tolerance apparatus includes a number of built-in self-test engines, wherein each of the built-in self-test engines corresponds to one of the memory storage devices. Thus, each of the built-in self-test engines test the corresponding memory storage device to determine if any faults exists therein. It is contemplated that each of the built-in self-test engines may have a number of fault address storage registers for storing the addresses of each fault that is detected; a fault indicator to indicate if a fault has been detected by the corresponding built-in self-test engine; and a fault tolerance enable register for enabling the corresponding built-in self-test engine to test the corresponding memory storage device. Finally, it is contemplated that a test failure indicator may be included to indicate to a requesting user that a fault has been detected by one of the built-in self-test engines, and to identify the offending memory device and to provide the fault addresses stored in the corresponding fault address storage registers. The requesting user may then avoid the use of those locations that have defects therein during normal functional operation of the circuit design.

In accordance with both of the above illustrative embodiments, it is contemplated that one or more defects may be detected for each memory device. Thus, the corresponding die is not deemed unusable unless the number of detected defects exceeds a predetermined fault tolerance number. If the die is deemed usable, even if one or more defects are detected, the location of the defects may be identified, and those locations may be avoided during normal functional operation of the circuit design. This may substantially increase the effective die yield of many integrated circuits, and may reduce the cost of producing those circuits.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
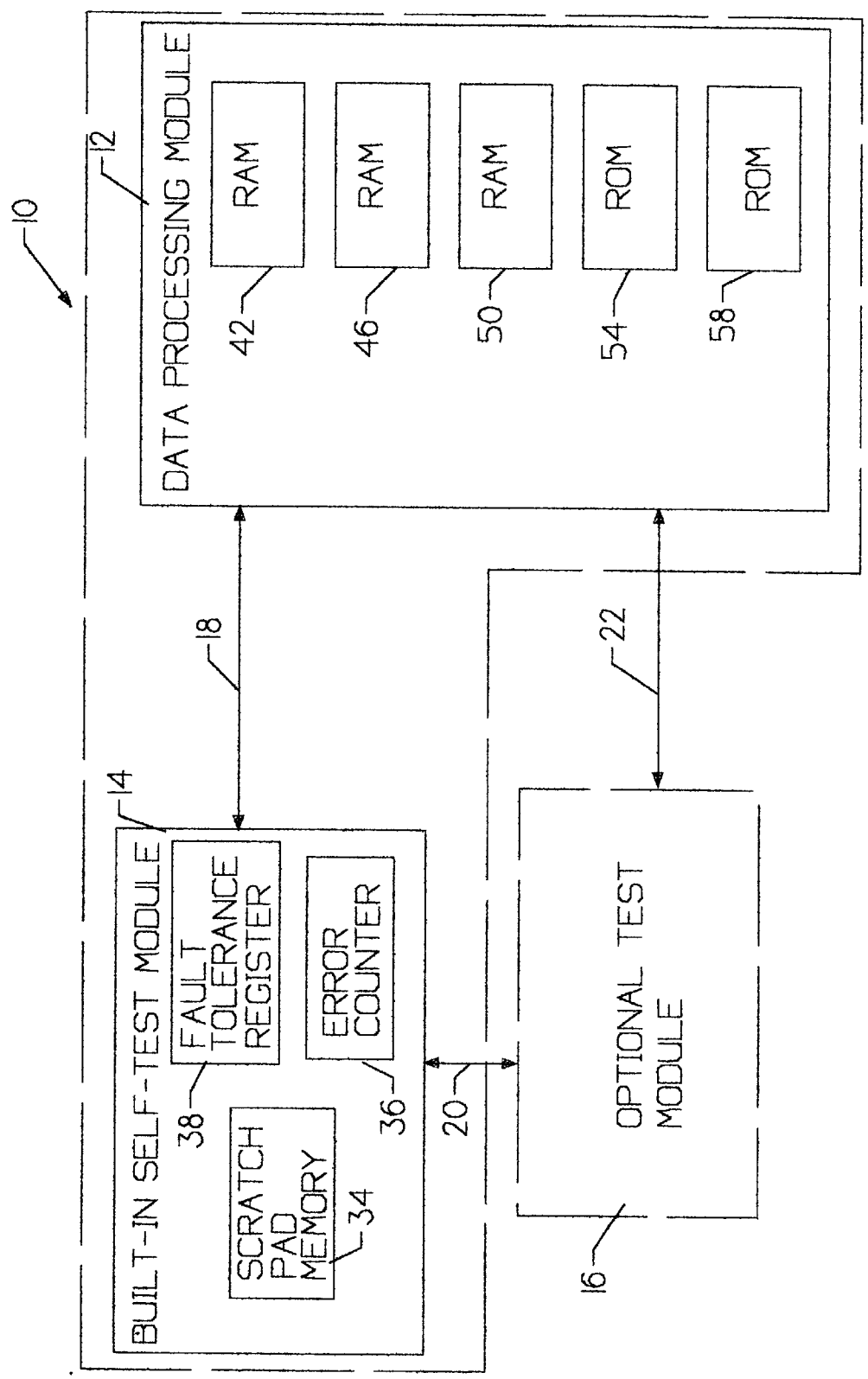
FIG. 1 is a block diagram of a data processing module incorporating a first illustrative embodiment of the present invention.

Referring now to the drawings, wherein like reference numerals refer to like elements throughout the several views, FIG. 1 is a block diagram of a data processing module incorporating a first illustrative embodiment of the present invention. The block diagram is shown generally at 10 and includes data processing module 12, built-in self-test module 14, and optional test module 16. Data processing module 12 may be a logic array circuit having a number of memory storage devices 42, 46, 50, 54 and 58 therein.

Built-in self-test module 14 interfaces directly to data processing module 12 via interface 18 and may be executed once for each memory storage device existing within data processing module 12. Alternatively, the built-in self-test engine may test each of the memory storage devices together, or may test each "type" of memory storage element together, for example, all RAMs may be tested first and all ROMs may be tested second.

The memory storage devices in the illustrative embodiment are of various types including RAM 42, RAM 46, RAM 50, ROM 54, and ROM 58. It is contemplated that any combination or number of RAMs or ROMs may be contained within data processing module 12 and may be tested by built-in self-test module 14. Preferably, built-in self-test module 14 is executed once for each of RAM 42, RAM 46, RAM 50, ROM 54 and ROM 58 within data processing module 12.

Built-in self-test module 14 may test other logic modules within data processing module 12 with the same method used to test RAM 42, RAM 46, RAM 50, ROM 54 and ROM 58. Prior to testing RAM 42, RAM 46, RAM 50, ROM 54 and ROM 58, built-in self-test module 14 scans in an acceptable fault tolerance number or level. The number of acceptable faults is scanned into fault tolerance register 38, and in the illustrative embodiment, is a number between 0 and 7. Each time built-in self-test module 14 tests one of RAM 42, RAM 46, RAM 50, ROM 54 or ROM 58, the total error count is updated to reflect any detected faults. The total error count is contained within error counter 36.

In accordance with the present invention, if the total error count contained within error counter 36 does not exceed the fault tolerance number scanned into fault tolerance register 38, data processing module 12 is considered valid and usable. As built-in self-test module 14 tests RAM 42, RAM 46, RAM 50, ROM 54 or ROM 58, the locations of each of the detected faults is recorded within scratch pad RAM 34. In the illustrative embodiment, scratch pad RAM 34 is sized to hold the fault locations for only one of RAM 42, RAM 46, RAM 50, ROM 54 or ROM 58. The contents of scratch pad RAM 14 may be downloaded or otherwise provided to optional test module 16 via interface 20, or to data processing module 12 via interface 18, before the built-in self-test module 14 proceeds testing the next memory element.

Data processing module 12 and built-in self-test module 14 may be contained within a die on a silicon wafer and optional test module 16 may be a conventional wafer probe type logic and memory tester. The locations of the faults detected within RAM 42, RAM 46, RAM 50, ROM 54 or ROM 58 may be downloaded to optional test module 16 via interface 20 and may be used by optional test module 16 to record those locations having faults. The fault locations may be recorded on a memory map for later identification and processing.

It is contemplated that optional test module 16 may be used to program predesigned replacement circuit elements via any number of approaches well known in the art. One approach is to use fusible links to replace the defected logic with the circuit design.

Figure 2:
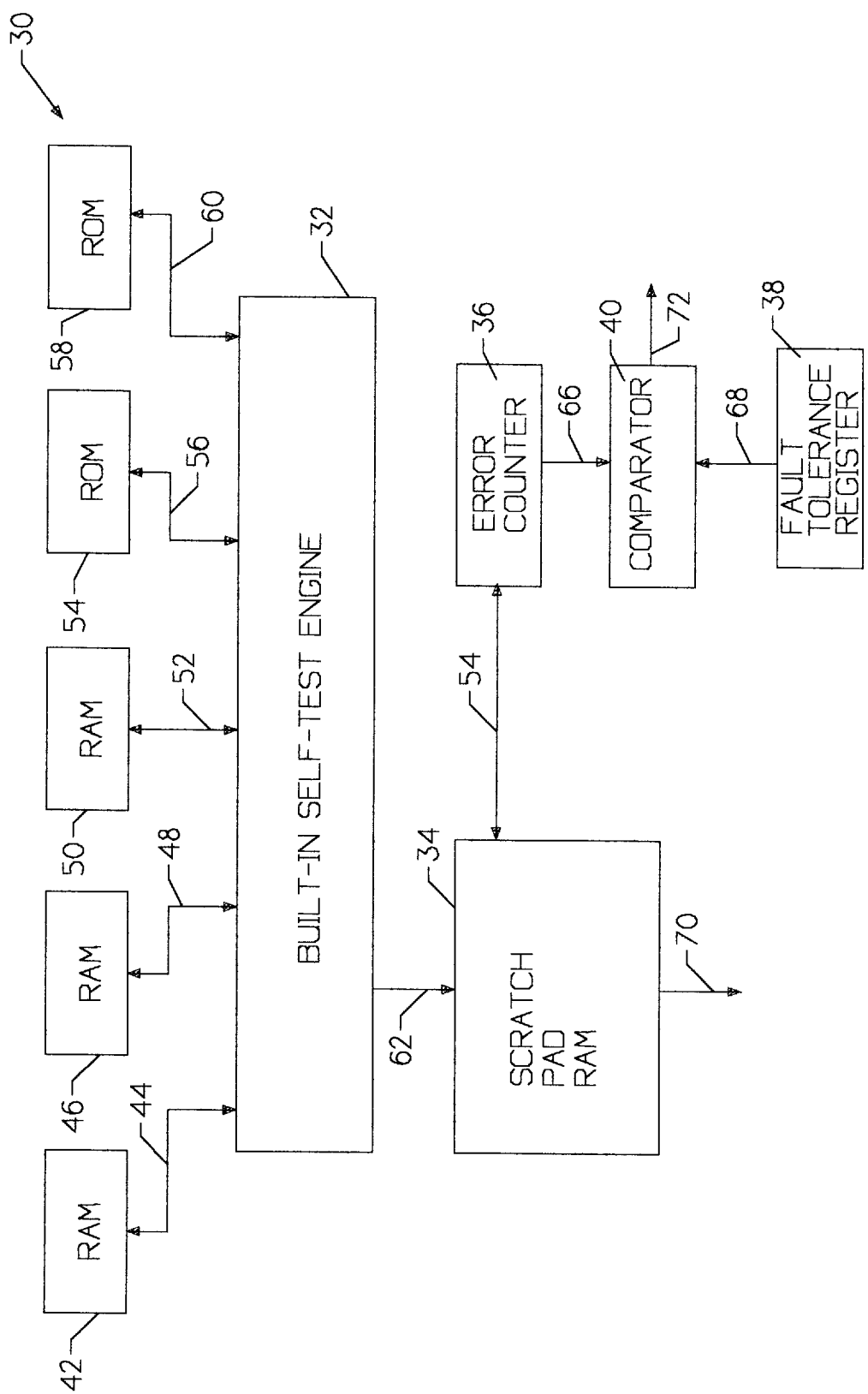
FIG. 2 is a more detailed block diagram of the first illustrative embodiment of the present invention.

FIG. 2 is a more detailed block diagram of the first illustrative embodiment of the present invention. The diagram is shown generally at 30, and includes a built-in self-test engine 32, a scratch pad RAM 34, an error counter 36, a fault tolerance register 38, and a comparer 40. In this embodiment, all selected memory circuits correspond to a single built-in self-test engine 32.

Built-in self-test engine 32 is coupled to RAM 42, RAM 45, RAM 50, ROM 54 and ROM 58 via interfaces 44, 48, 52, 56 and 60, respectively. Preferably, built-in self-test engine 32 is separately executed for each storage device to reduce the hardware necessary to support the testing function. Further, built-in self-test engine 32 may perform these tests using any number of methods well known in the art. For RAM 42, RAM 46 and RAM 50, built-in self-test engine 32 may write and read a known test pattern into RAM 42, RAM 46 or RAM 50. This known test pattern may be a checkerboard pattern, an all ones pattern, an all zeros pattern, or another other desired pattern. Built-in self-test engine 32 may test ROM 54 or ROM 58 by reading the contents of ROM 54 or ROM 58 and comparing the resulting data to an expected result.

In accordance with the present invention, a fault tolerance number or level can be set to a number greater than zero. As indicated above, the fault tolerance number represents the number of memory device faults that will be tolerated before the circuit or die is deemed unusable. In the illustrative embodiment, the fault tolerance can be set by scanning a fault tolerance number into fault tolerance register 38. Preferably, the fault tolerance number is between 1 and 7, and is set prior to testing RAM 42, RAM 46, RAM 50, ROM 54 or ROM 58 with built-in self-test engine 32.

In the illustrative embodiment, scratch pad RAM 34 receives data from built-in self-test engine 32 each time built-in self-test engine 32 completes testing one of the memory devices RAM 42, RAM 46, RAM 50, ROM 54 or ROM 58. Prior to testing, scratch pad RAM 34 is verified as being defect free. As built-in self-test engine 32 tests the RAM 42, RAM 46, RAM 50, ROM 54 and ROM 58, fault information is provided from built-in self-test engine 32 to scratch RAM 34 to reflect the detected faults in the corresponding memory element. The fault information preferably includes fault addresses information used to identify the memory storage locations within RAM 42, RAM 46, RAM 50, ROM 54 or ROM 58 that had a detected fault. The contents of scratch pad RAM 34 may be downloaded via interface 70 to a main memory storage unit or other requesting user.

The first illustrative embodiment further includes an error counter 36. The error counter 36 is coupled to scratch pad RAM 34 via path 54. Each time built-in self-test engine 32 tests one the memory devices RAM 42, RAM 46, RAM 50, ROM 54 or ROM 58, error counter 36 is updated to reflect the number of faults detected therein. Once each of RAM 42, RAM 46, RAM 50, ROM 54 or ROM 58 has been tested, the total error count contained within error counter 36 is compared to the fault tolerance number scanned into fault tolerance register 38 by comparator 40. If the total error count contained within error counter 36 does not exceed the fault tolerance number scanned into fault tolerance register 38, the die or circuit is considered usable. If, however, the total error count exceeds the fault tolerance number, the die is deemed unusable. Fault tolerance register 38 is coupled to comparator 40 via interface 68, and error counter 36 is coupled to comparator 40 via interface 66.

Comparator 40 provides an output via path 72 indicating whether or not the circuit die is usable. If built-in self-test engine 32 tests RAM 42, RAM 46, RAM 50, ROM 54, and ROM 58 while the circuit is in die form, comparator 40 provides the indication of die validity via interface 72 to a memory tester that is testing the die at the wafer level. If the die is deemed not usable, the memory tester may either record the location of the die on the wafer or ink stamp the die on the wafer to prevent subsequent packaging.

Figure 3:
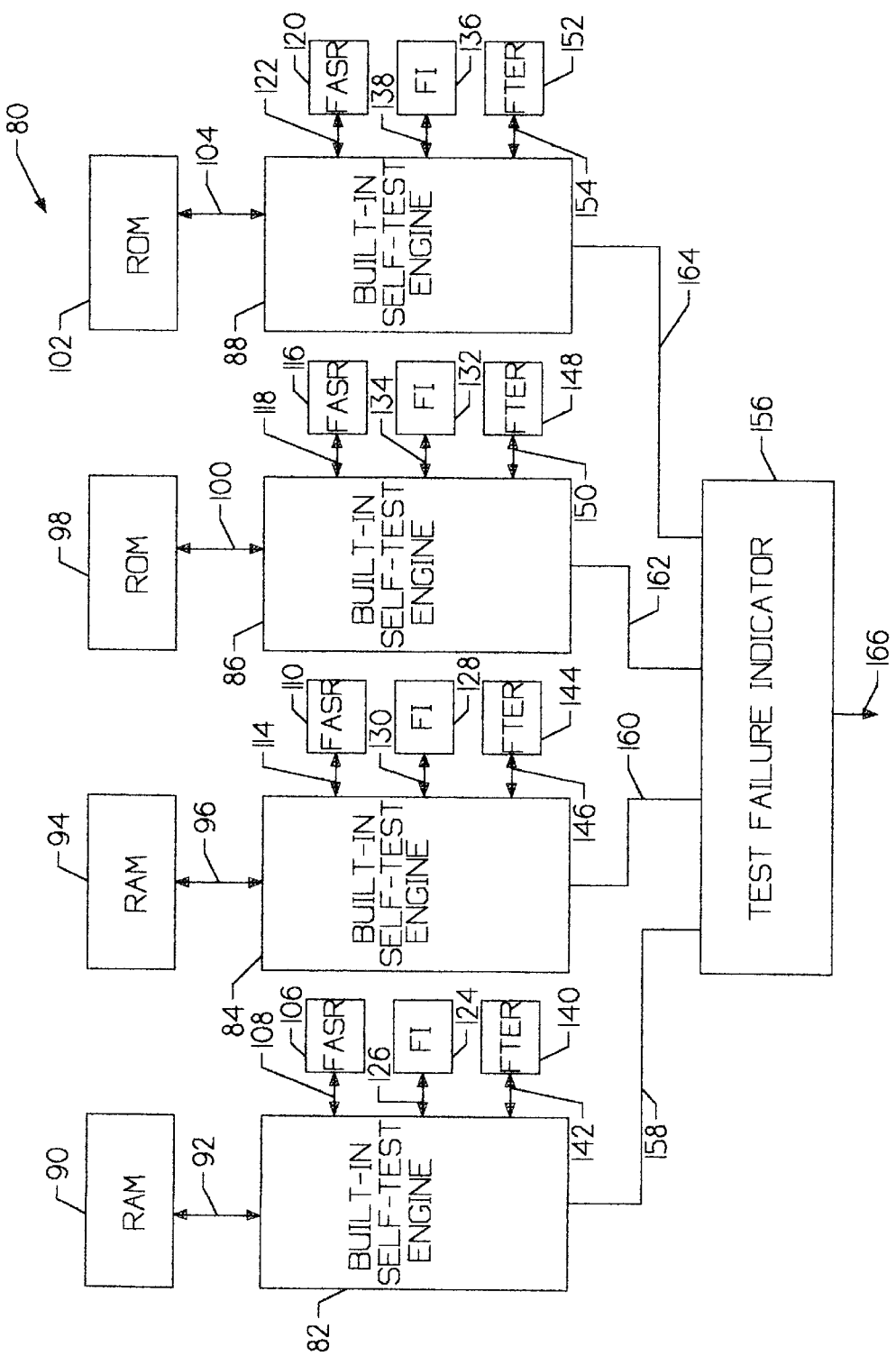
FIG. 3 is a block diagram of a second illustrative embodiment of the invention.

FIG. 3 is a block diagram of a second illustrative embodiment of the invention. The diagram is generally shown at 80 and includes built-in self-test engines 82, 84, 86 and 88. Each built-in self-test engine is dedicated to a corresponding memory element. For example, built-in self-test engine 82 is coupled to RAM 90 via interface 92. Likewise, built-in self-test engines 84, 86 and 88 are coupled memory elements 94, 98 and 102 via interfaces 96, 100 and 104, respectively.

Each built-in self-test engine 82, 84, 86 and 88 have a dedicated fault address storage register, fault indicator and fault tolerance enable register. For example, built-in self-test engine 82 has, a dedicated fault address storage register 106, a fault indicator 124 and a fault tolerance enable register 140.

Each fault address storage register 106, 110, 116 and 120 may hold a number of fault addresses, wherein each fault address identifies a storage location within the corresponding memory device RAM 90, RAM 94, ROM 98 and ROM 102 that includes a detected fault therein. This information may be provided to a test failure indicator block 156 when requested.

In addition to the above, each fault indicator, for example fault indicators 124, 128, 132 and 136, stores a bit that indicates if a fault has been detected in the corresponding memory device. If no fault is detected, the test failure indicator 156 need not query the corresponding built-in self-test engine for the fault addresses stored in the corresponding fault address storage register.

Finally, each fault tolerance enable register, for example fault tolerance enable registers 140, 144, 148 and 152, stores a bit that enables the corresponding built-in self-test engine 82 to test the corresponding memory device. This provides a way for enabling and disabling selected built-in self-test engines 82, 84, 86 and 88.

Test failure indicator 156 is coupled to built-in self-test engines 82, 84, 86 and 88 via interfaces 158, 160, 162 and 164, respectively. The test failure indicator 156 may provide an interface and centralized control for each of the built-in self-test engines. Thus, test failure indicator 156 may query each built-in self-test engine and determine if the corresponding fault indicator bit (e.g. fault indicator bits 124, 128, 132 and 136) is set. For those built-in self-test engines that have their corresponding fault indicator bit set, the test failure indicator 156 may read the contents of the corresponding fault address storage registers 106, 110, 116 and 120 to uniquely identify the locations of all detected faults within memory devices 90, 94, 98 and 102. The test failure indicator 156 may then download the results to a requesting user via interface 166.

Figure 4A:
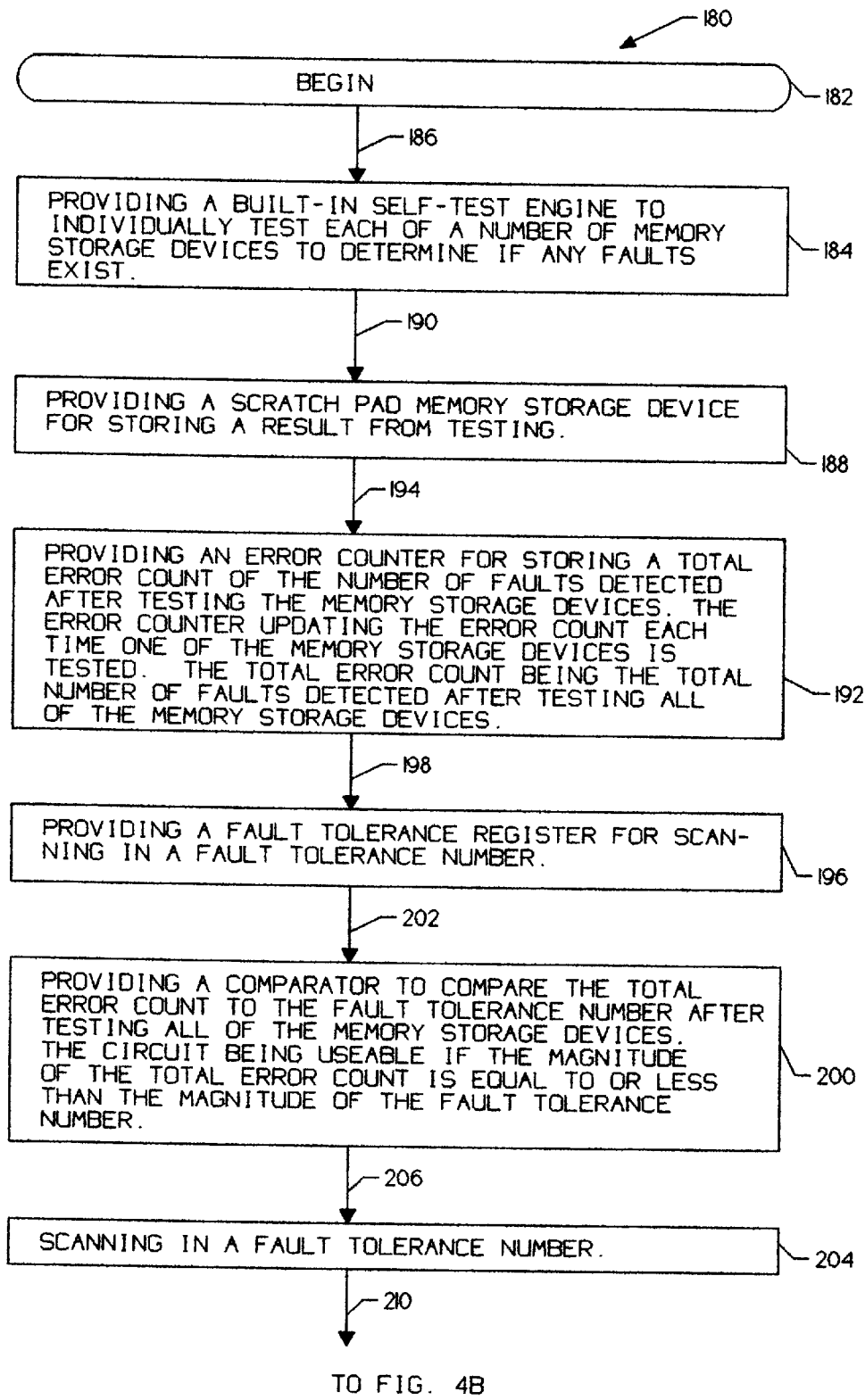
FIGS. 4A–4B are a flow diagram showing a first illustrative method of the present invention.
Figure 4B:
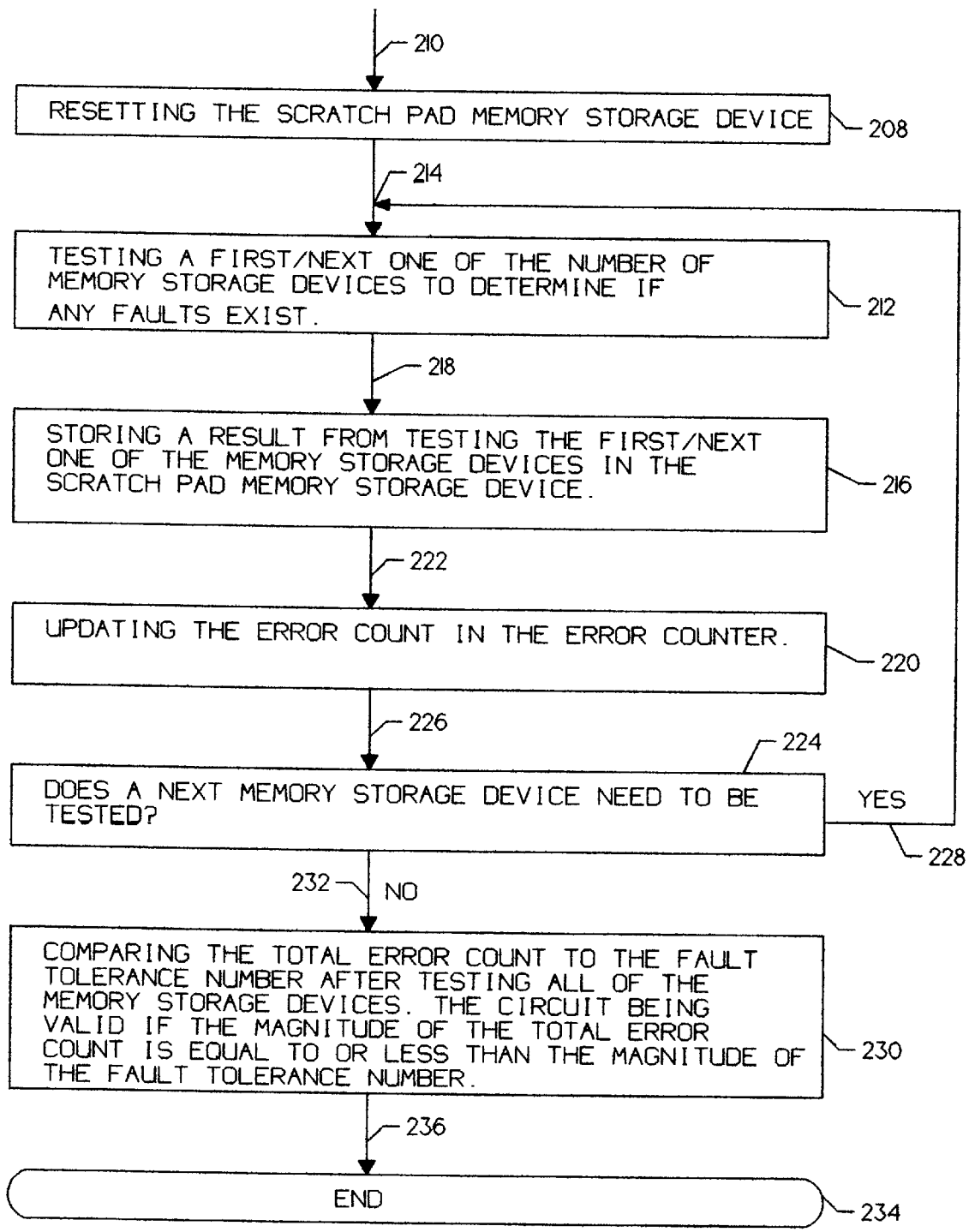

FIGS. 4A–4B are a flow diagram showing a first illustrative method of the present invention. The diagram is shown generally at 180. The flow diagram is entered at element 182, wherein control is passed to element 184 via interface 186. Element 184 provides a built-in self-test engine to individually test each of a number of memory storage devices, to determine if any faults exist. Control is then passed to element 188 via interface 190. Element 188 provides a scratch pad memory storage device for storing a location of detected defects within at least one of the memory devices. Control is then passed to element 192 via interface 194. Element 192 provides an error counter for storing a total error count of the number of faults detected during the testing of the memory devices. Preferably, the error counter updates the error count after each of the memory devices is tested by the built-in self-test engine. Thus, in a preferred embodiment, the total error count is a total number of faults detected after all of the memory storage devices are tested. Control is then passed to element 196 via interface 198.

Element 196 provides a fault tolerance register for scanning in a fault tolerance number. Control is then passed to element 200 via interface 202. Element 200 provides a comparator to compare the total error count to the fault tolerance number, preferably after all of the memory devices are tested.

Control is then passed to element 204 via interface 206. Element 204 scans in a fault tolerance number. Control is then passed to element 208 via interface 210. Element 208 resets the scratch pad memory storage device. Control is then passed to element 212 via interface 214. Element 212 tests a first/next one of the number of memory storage devices to determine if any faults exist therein. Control is then passed to element 216 via interface 218. Element 216 stores the locations of any defects detected in the first/next memory storage device in the scratch pad memory storage device. Control is then passed to element 220 via interface 222. Element 220 updates the error count in the error counter. Control is then passed to element 224 via interface 226.

Element 224 determines whether any other of the storage devices need to be tested. If more storage devices need to be tested, control is passed back to element 212 via interface 228 and the algorithm is continued. If no other storage devices need to be tested, control is passed to element 230 via interface 232. Element 230 compares the total error count to the fault tolerance number. If the magnitude of the total error count is equal to or less than the magnitude of the fault tolerance number, the circuit is deemed to be usable. Control is then passed to element 234 via interface 236, where the algorithm is exited.

Figure 5A:
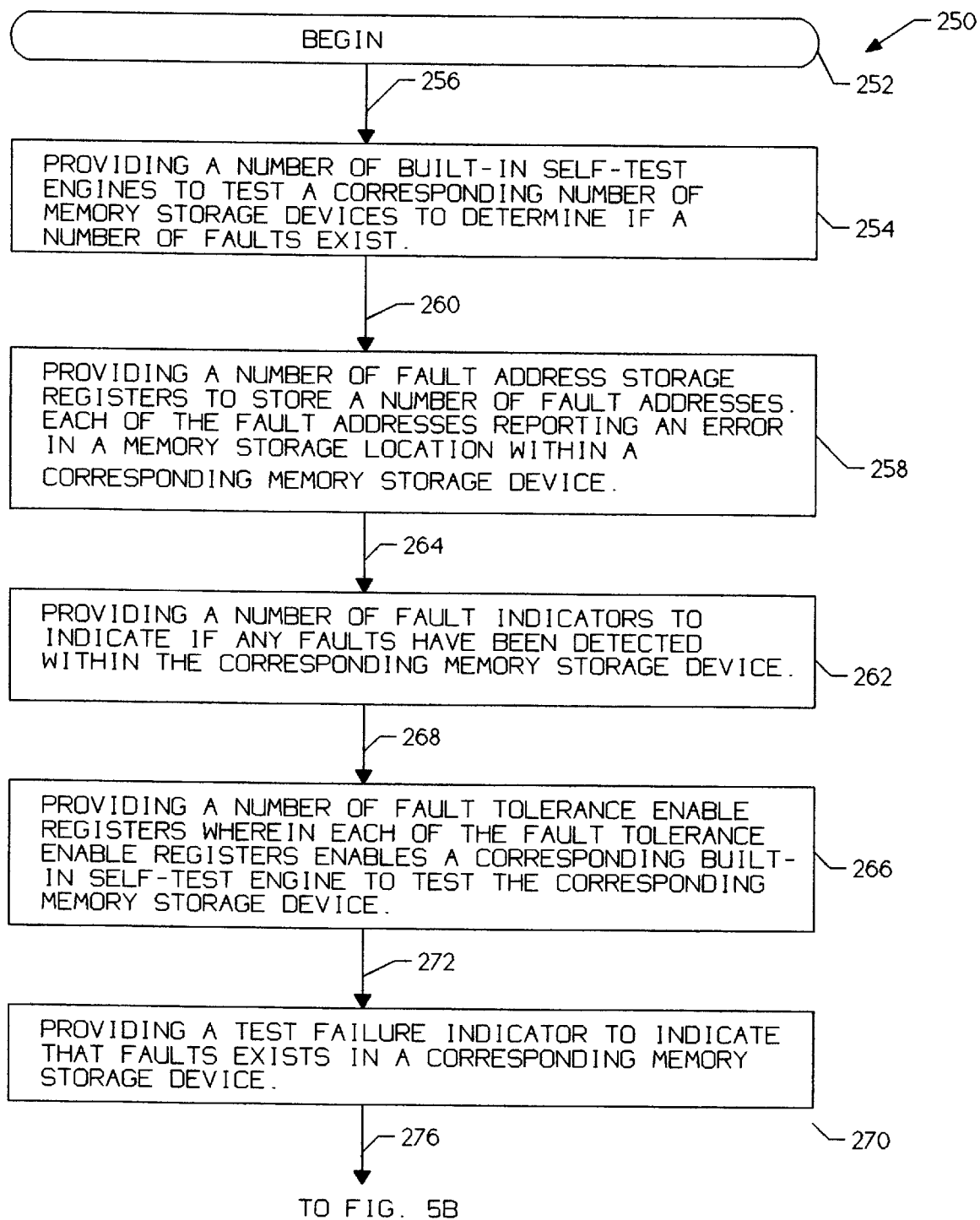
FIGS. 5A–5B are a flow diagram showing a second illustrative method of the present invention.
Figure 5B:
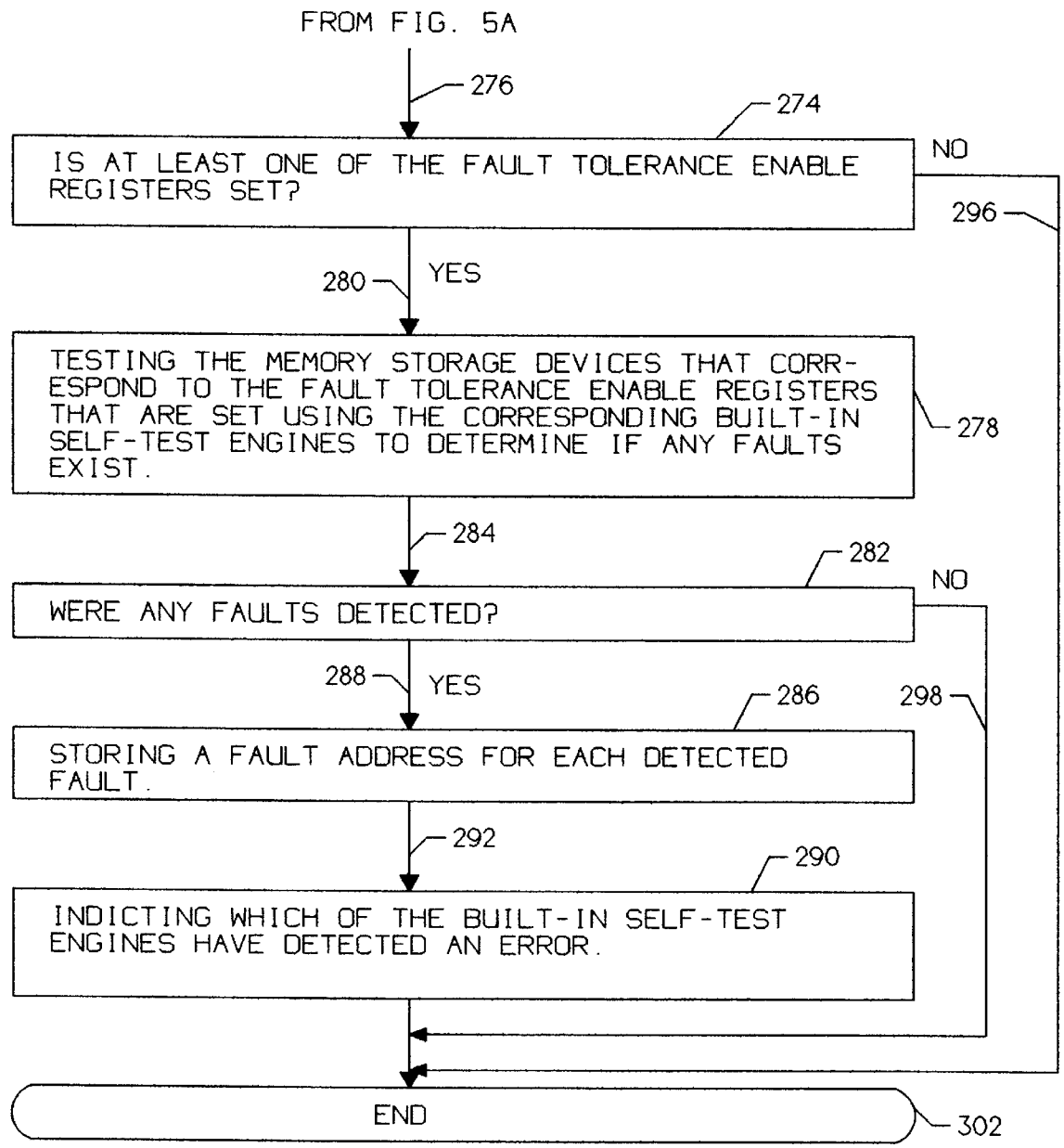

FIGS. 5A–5B are a flow diagram showing a second illustrative method of the present invention. The diagram is shown generally at 250. The flow diagram is entered at element 252, wherein control is passed to element 254 via interface 256. Element 254 provides a number of built-in self-test engines, wherein each built-in self-test engine is dedicated to testing one of the number of memory storage devices, and is used to determine if any faults exist therein. Control is then passed to element 258 via interface 260. Element 258 provides a number of fault address storage registers to store a number of fault addresses. Each of the fault addresses identifies a particular storage location that contains a detected fault within a corresponding memory storage device. Control is then passed to element 262 via interface 264. Element 262 provides a number of fault indicators, wherein each fault indicator indicates if any faults have been detected in the corresponding memory storage devices. Control is then passed to element 266 via interface 268. Element 266 provides a number of fault tolerance enable registers, wherein each of the fault tolerance enable registers enable a corresponding built-in self-test engine to test the corresponding memory storage device. Control is then passed to element 270 via interface 272. Element 270 provides a test failure indicator to report that at least one fault exists in at least one of the memory storage devices, and preferably, the location of each fault. Control is then passed to element 274 via interface 276.

Element 274 determines which, if any, of the fault tolerance enable registers are set. If at least one of the selected fault tolerance enable registers are set, control is passed to element 278. If none of the selected fault tolerance enable register are set, control is passed to element 302 via interface 296.

Element 278 tests the memory storage device that corresponds to the fault tolerance enable registers that are set using the corresponding built-in self-test engines. Control is then passed to element 282 via interface 284. Element 282 determines if any faults were detected. This is accomplished by examining the contents of the fault indicators associated with each of the built-in self-test engines. If no faults were detected, control is passed to element 302 via interface 298, wherein the algorithm is exited. If at least one fault was detected, control is passed to element 286 via interface 288.

Element 286 stores a fault address for each of the detected faults in the fault address storage register that correspond to the memory device where the fault occurred. Control is then passed to element 290 via interface 292. Element 290 determines which of the built-in self-test engines detected an error. This is accomplished by examining the contents of the fault indicators associated with each of the built-in self-test engines. This information may be provided to a requesting user via a test failure indicator (see FIG. 3). Control is then passed to element 302 for exit.

Having thus described the preferred embodiments of the present invention, those of skill in the art will readily appreciate that the teachings found herein may be applied to yet other embodiments within the scope of the claims hereto attached.

What is claimed is:

1. A self-test apparatus for inclusion in a circuit design, wherein the circuit design includes a number of memory elements, comprising:
    a. a built-in self-test engine coupled to selected ones of the number of memory elements for testing each of the selected ones of the number of memory elements, and for identifying if any defects are present in the selected ones of the number of memory elements, and the locations of the defects;
    b. a fault storage means coupled to said built-in self-test engine for storing the locations of more than one of the defects identified by the built-in self-test engine;
    c. a defect counter coupled to said fault storage means for storing a total defect count of said more than one of the defects identified after testing the selected ones of the number of memory elements;
    d. a fault tolerance register for storing a fault tolerance number; and
    e. a comparator coupled to said defect counter and to said fault tolerance register to compare said total defect count to said fault tolerance number after testing the number of memory elements, the number of memory elements being valid if a magnitude of said total defect count has a predetermined relationship with said fault tolerance number.

2. A programmable fault tolerance apparatus which executes a built-in self-test operation on a logic array circuit, wherein the logic array circuit has a number of memory storage devices, comprising:
    a. a built-in self-test engine coupled to each of the number of memory storage devices on the logic array circuit, the built-in self-test engine for testing each of the number of memory storage devices to determine if one or more faults exist therein;
    b. a scratchpad memory storage device coupled to said built-in self-test engine for storing a location for each of the faults that are detected by the built-in self-test engine;
    c. an error counter coupled to said scratchpad memory storage device for storing a total error count of said one or more faults detected after testing the number of memory storage devices;
    d. a fault tolerance register for storing a fault tolerance number; and e. a comparator coupled to said error counter and to said fault tolerance register to compare said total error count to said fault tolerance number after testing the number of memory storage devices, the logic array circuit being valid if the magnitude of said total error count has a predetermined relationship with said fault tolerance number.

3. A programmable fault tolerance apparatus according to claim 2 wherein the fault tolerance register scans in a fault tolerance number between zero and seven.

4. A programmable fault tolerance apparatus according to claim 2 wherein one or more of the number of memory storage devices are read only memories.

5. A programmable fault tolerance apparatus according to claim 2 wherein one or more of the number of memory storage devices are random access memories.

6. A programmable fault tolerance apparatus according to claim 2 wherein the location of any faults that are detected by the built-in self-test engine corresponds to an address location.

7. A programmable fault tolerance apparatus according to claim 6 wherein the scratchpad memory storage device is cleared and reloaded with the fault addresses for a second one of the number of storage devices after a first one of the number of storage devices has been tested by the built-in self-test engine.

8. A programmable fault tolerance apparatus according to claim 7 wherein the scratchpad memory storage device is a random access memory.

9. A self-test apparatus according to claim 1 wherein the number of memory elements are a number of die on a wafer, each said defect identified within a one of said number of die by said built-in self-test engine indicating a result of testing said one of said number of die which did not correspond to an expected result.

10. A method of executing a built-in self-test operation on a circuit design having a number of memory elements therein, the method comprising the steps of:
   a. providing a built-in self-test engine coupled to selected ones of the number of memory elements;
   b. testing each of the selected ones of the number of memory elements using the built-in self-test engine;
   c. identifying if any defects are present in the selected ones of the number of memory elements, and the locations of the defects;
   d. storing the locations of more than one of the defects identified by the built-in self-test engine;
   e. storing a fault tolerance number;
   f. storing a total defect count of said more than one of the defects identified after testing the selected ones of the number of memory elements; and
   g. comparing said total defect count to said fault tolerance number after testing the number of memory elements, the number of memory elements being valid if a magnitude of said total defect count has a predetermined relationship with said fault tolerance number.

11. A method of executing a built-in self-test operation on a logic array circuit having a number of memory storage devices, comprising the steps of:
   a providing a built-in self-test engine to test the number of memory storage devices to determine if a number of faults exist;
   b. providing a scratchpad memory storage device for storing a result of testing the number of memory storage devices on the logic array circuit if said number of faults are detected;
   c. providing an error counter for storing a total error count of said number of faults detected after testing the number of memory storage devices, said error counter updating said error count each time a particular one of the number of memory storage devices on the logic array circuit is tested when said number of faults are detected, said total error count being the total number of faults detected after testing the number of memory storage devices;
   d. providing a fault tolerance register for scanning in a fault tolerance number;
   e. providing a comparator to compare said total error count to said fault tolerance number after testing the number of memory storage devices, the logic array circuit being valid if the magnitude of said total error count is equal to or less than the magnitude of said fault tolerance number;
   f. scanning in said fault tolerance number;
   g. resetting the scratchpad memory storage device;
   h. testing said particular one of the number of memory storage devices to determine if said number of faults exist;
   i. storing a result of testing said particular one of the number of memory storage devices in the scratchpad memory storage device if said number of faults are detected;
   j. updating said error count in said error counter if said number of faults are detected;
   k. going to step (h) if all said particular ones of the number of memory storage devices have not been tested to test the next said particular one of the number of memory storage devices; and
   l. comparing said total error count to said fault tolerance number after testing the number of memory storage devices, the logic array circuit being valid if the magnitude of said total error count is equal to or less than the magnitude of said fault tolerance number.

12. A method according to claim 11 wherein the step of resetting the scratchpad memory storage device further includes the step of verifying that the scratchpad memory storage device has no functional faults prior to beginning the step of testing the particular one of the number of memory storage devices to determine if the number of faults exist.

13. A method according to claim 12 wherein the step of updating said error count in said error counter if the number of faults are detected further comprises the step of downloading the data in the scratchpad memory storage device to a main memory storage unit.

14. A programmable fault tolerance apparatus to execute a built-in self-test operation on a logic array circuit having a number of memory storage devices, comprising:
   a. a number of built-in self-test engines wherein each particular one of said number of built-in self-test engines is coupled to a corresponding particular one of the number of memory storage devices on the logic array circuit so that each particular one of said number of built-in self-test engines can test said corresponding particular one of the number of memory storage devices to determine if a number of faults exist;
   b. a number of fault address storage registers wherein each particular one of said number of fault address storage registers is coupled to said corresponding particular one of said number of built-in self-test engines to hold a number of fault addresses, each particular one of said number of fault addresses indicating a particular one of a number of memory storage locations within said corresponding particular one of said number of memory storage devices containing a detected fault;

c. a number of fault indicators wherein each particular one of said number of fault indicators is coupled to said corresponding particular one of said number of built-in self-test engines to indicate if said fault has been detected within said corresponding particular one of said number of memory storage devices; and d. a number of fault tolerance enable registers wherein each particular one of said number of fault tolerance enable registers is coupled to said corresponding particular one of said number of built-in self-test engines, said corresponding particular one of said number of fault tolerance enable registers being set enabling said corresponding particular one of said number of built-in self-test engines to test said corresponding particular one of the number of memory storage devices, said corresponding particular one of said number of fault tolerance enable registers not being set disabling said corresponding particular one of said number of built-in self-test engines from testing said corresponding particular one of the number of memory storage devices; and e. a test failure indicator coupled to said number of built-in self-test engines to indicate that said number of faults exists in said corresponding particular one of the number of memory storage devices if said corresponding particular one of said number of fault tolerance enable registers is set and said particular one of said number of built-in self-test engines has determined said number of faults exist in said corresponding particular one of the number of memory storage devices, said test failure indicator reading the contents of said number of fault address storage registers to uniquely identify all of said number of memory storage locations within all of the number of memory storage devices containing detected faults.

15. A programmable fault tolerance apparatus according to claim 14 comprising a downloading means coupled to the number of fault address storage registers to download the number of fault addresses from the corresponding particular one of said number of fault address storage registers to a main memory storage unit.

16. A programmable fault tolerance apparatus according to claim 14 wherein the number of fault addresses is one fault address.

17. A programmable fault tolerance apparatus according to claim 14 wherein the fault exists if a particular one of a number of memory storage locations within the corresponding particular one of the number of memory storage devices being tested by the corresponding particular one of the number of built-in self-test engines does not contain known data, each said particular one of said number of memory storage locations within the corresponding particular one of the number of memory storage devices not containing said known data being one detected fault.

18. A programmable fault tolerance apparatus according to claim 17 wherein the known data is a memory test pattern if the corresponding particular one of the number of memory storage devices being tested is a random access memory, the built-in self-test engine writing said memory test pattern into the number of memory storage locations located within said random access memory and reading the same number of memory storage locations within said random access memory to determine if data read from said random access memory is equivalent to said memory test pattern previously written into said random access memory, said data and said memory test pattern not being equivalent indicating that the number of detected faults exist within said random access memory being tested.

19. A programmable fault tolerance apparatus according to claim 17 wherein the known data is a programmed data pattern if the corresponding particular one of the number of memory storage devices being tested is a read only memory, the built-in self-test engine reading the number of memory storage locations within said read only memory to determine if data read from said read only memory is equivalent to said programmed data pattern previously programmed into said read only memory, the data read not being equivalent to said programmed data pattern indicating that the number of detected faults exist within the read only memory being tested.

20. A programmable fault tolerance apparatus according to claim 14 wherein one or more of the number of memory storage devices are read only memories.

21. A programmable fault tolerance apparatus according to claim 14 wherein one or more of the number of memory storage devices are random access memories.

22. A programmable fault tolerance apparatus according to claim 21 wherein the random access memories are dynamic random access memories.

23. A programmable fault tolerance apparatus according to claim 21 wherein the random access memories are static random access memories.

24. A programmable fault tolerance apparatus according to claim 17 wherein each particular one of the number of fault address storage registers is a random access memory.

25. A programmable fault tolerance apparatus according to claim 24 wherein the random access memory is a dynamic random access memory.

26. A programmable fault tolerance apparatus according to claim 24 wherein the random access memory is a static random access memory.

27. A programmable fault tolerance apparatus according to claim 14 wherein the logic array circuit is a die on a wafer.

28. A method of executing a built-in self-test operation on a logic array circuit having a number of memory storage devices, comprising the steps of:

a. providing a number of built-in self-test engines to test a corresponding particular one of the number of memory storage devices to determine if a number of faults exist;

b. providing a number of fault address storage registers to hold a number of fault addresses, each particular one of said number of fault addresses indicating a particular one of a number of memory storage locations within said corresponding particular one of said number of memory storage devices contains a detected fault;

c. providing a number of fault indicators to indicate if said number of faults has been detected within said corresponding particular one of said number of memory storage devices;

d. providing a number of fault tolerance enable registers wherein a corresponding particular one of said number of fault tolerance enable registers being set enables said corresponding particular one of said number of built-in self-test engines to test said corresponding particular one of the number of memory storage devices, said corresponding particular one of said number of fault tolerance enable registers not being set disabling said corresponding particular one of said number of built-in self-test engines from testing said corresponding particular one of the number of memory storage devices;

e. providing a test failure indicator to indicate that said number of faults exists in said corresponding particular one of the number of memory storage devices if said corresponding particular one of said number of fault tolerance enable registers is set and said particular one of said number of built-in self-test engines has determined said number of faults exist in said corresponding particular one of the number of memory storage devices, said test failure indicator reading the contents of said number of fault address storage registers to uniquely identify all of said number of memory storage locations within all of the number of memory storage devices containing detected faults;

f. going to step (k) if said corresponding particular one of said number of fault tolerance enable registers is not set;

g. testing said corresponding particular one of the number of memory storage devices with said corresponding number of built-in self-test engines to determine if said number of faults exist;

h. going to step (k) if said corresponding number of built-in self-test engines determines said number of faults does not exist in said corresponding particular one of the number of memory storage devices;

i. storing said number of fault addresses, each said particular one of said number of fault addresses corresponding to said particular one of said number of memory storage locations within said corresponding particular one of said number of memory storage devices where said fault has been detected;

j. indicating that said number of faults has been detected within said corresponding particular one of said number of memory storage devices; and k. going to step (f) if all said corresponding particular ones of the number of memory storage devices have not been tested to test the next said corresponding particular one of the number of memory storage devices.

29. A method according to claim 28 wherein the step of storing the number of fault addresses further includes the step of downloading the number of fault addresses from the corresponding particular one of said number of fault address storage registers to a main memory storage unit.

* * * * *